United States Patent [19]
Inata et al.

[11] Patent Number: 5,266,814
[45] Date of Patent: Nov. 30, 1993

[54] OPTICALLY ACTIVATED RESONANT-TUNNELING TRANSISTOR

[75] Inventors: Tsuguo Inata; Shunichi Muto, both of Kawasaki, Japan

[73] Assignee: Fujitsu Limited, Kawasaki, Japan

[21] Appl. No.: 757,185

[22] Filed: Sep. 10, 1991

[30] Foreign Application Priority Data

Sep. 10, 1990 [JP] Japan .................................. 2-237111

[51] Int. Cl.$^5$ ...................... H01L 27/14; H01L 31/00
[52] U.S. Cl. ........................................ 257/25; 257/14; 257/21; 257/23; 257/29
[58] Field of Search ................. 357/30 E; 257/14, 21, 257/23, 24, 25, 26, 27, 29, 184, 197, 462, 464

[56] References Cited

U.S. PATENT DOCUMENTS 4,814,847  3/1989  Tabatabaie ........................ 357/306
5,121,181  6/1992  Smith, III et al. .................... 357/4

Primary Examiner—Sara W. Crane
Attorney, Agent, or Firm—Staas & Halsey

[57] ABSTRACT

A resonant-tunneling transistor comprises a first semiconductor layer acting as a collector, a second semiconductor layer provided on the first semiconductor layer and forming a potential barrier of electrons in the conduction band, a third semiconductor layer provided on the second semiconductor layer and forming a quantum well of electrons in the conduction band, a fourth semiconductor layer provided on the third semiconductor layer and forming a quantum well of holes in the valence band, the fourth semiconductor layer simultaneously forming a potential barrier of electrons in the conduction band, a fifth semiconductor layer provided on the fourth semiconductor layer acting as an emitter, a first electrode provided in contact with the first semiconductor layer for recovering electrons therefrom, a second electrode provided in contact with the fifth semiconductor layer for injecting electrons thereinto, and an optical passage for introducing an optical beam to the first semiconductor layer.

16 Claims, 13 Drawing Sheets

OPTICALLY ACTIVATED RESONANT-TUNNELING TRANSISTOR

BACKGROUND OF THE INVENTION

The present invention generally relates to semiconductor devices and more particularly to a resonant-tunneling transistor that is operated in response to irradiation of light.

Since the pioneering work of Esaki and Tsu (Esaki, L. and T. Tsu, "Superlattice and Negative Conductivity in Semiconductors," IBM Research Note, RC-2418, 1969), intensive efforts have been made to realize the quantum effect semiconductor devices that utilize the resonant-tunneling of carriers through a quantum well structure formed in the device. Typically, the quantum well structure is formed by a quantum well layer sandwiched between a pair of extremely thin barrier layers. In such a quantum well structure, there is formed a quantum level in the quantum well layer at an energy level corresponding to the thickness of the quantum well layer, and the quantum well structure shows a high transmittance when the energy of the incident electrons coincides with the energy level of the quantum state in the quantum well layer. Such a phenomenon is called the resonant-tunneling and is characterized by a negative differential resistance in which the current flowing through the device decreases with increasing input voltage.

For example, Esaki has proposed in the U.S. Pat. No. 280,141, a resonant-tunneling transistor that uses the negative differential resistance for the principle of operation. The concept of the transistor has been further developed by many researchers and various devices are proposed so far. For example, Yokoyama et al. (Yokoyama, N., Imamura, K., Muto, S., Hiyamizu S. and Nishi, H., "A New Functional, Resonant-tunneling Hot Electron Transistor (RHET)," Japanese J. Appl. Phys. 24, L853, 1985) proposed a resonant-tunneling hot electron transistor (RHET) wherein the flow of hot electrons that has passed through the quantum well structure is controlled in response to a control voltage applied to a base layer that is provided adjacent to the quantum well structure.

FIG. 1 shows a fundamental resonant-tunneling transistor corresponding to the device proposed by Esaki.

Referring to FIG. 1, the transistor is constructed on a semi-insulating GaAs substrate 11 and includes a layered body 10 of semiconductor materials that in turn includes an n-type collector layer 12 of GaAs provided on the substrate 11, a lower barrier layer 13 of undoped AlGaAs that is formed on the collector layer 12, an active layer 14 of undoped GaAs provided on the lower barrier layer 13, an upper barrier layer 15 of undoped AlGaAs provided on the active layer 14, and an emitter layer 16 of n-type GaAs provided on the upper barrier layer 15. There, the thickness of the active layer 14 is less than about 100 Å and there is formed a quantum well structure characterized by a discrete quantum level in the active layer 14.

The layered body 10 is formed to have a mesa structure 10A such that the upper major surface of the collector layer 12 and the upper major surface of the base layer 14 are exposed at the outside of the mesa structure 10A. The mesa structure 10A in turn is covered by an insulating film 17, and an emitter electrode 18 is provided in contact with the upper major surface of the emitter layer 16 via a contact hole provided in the insulating film 17, a base electrode 19 is provided in contact with the upper major surface of the base layer 14 via a contact hole in the insulating film 17 at a part of the layered semiconductor body 10 located outside of the mesa structure, and a collector electrode 20 is provided in contact with the upper major surface of the collector layer 12 via a contact hole in the insulating film 17 at a part of the layered body 10 located outside of the mesa structure 10A. Thereby, a quantum well is formed in the base layer 14 that is bounded by the upper and lower barrier layers 15 and 13 and there is formed a quantum state in the base layer 14 at an energy level corresponding to the thickness of the layer 14.

In the device of FIG. 1, a drive voltage is applied across the collector electrode 20 and the emitter electrode 18 such that the emitter layer 16 is biased negatively with respect to the collector layer 12. Further, a variable bias voltage is applied across the collector electrode 20 and the base electrode 19. By suitably choosing the base voltage, one can set the energy level of the quantum state formed in the base layer 14 to be coincident with the energy level of the electrons in the emitter layer 16. Thereby, one observes the resonant-tunneling of the electrons from the emitter layer 16 to the collector layer 12, and this conventional device shows the negative differential resistance.

The conventional device of FIG. 1, however, has a fabrication problem because of the extremely small thickness of the base layer 14 that is typically smaller than about 100 Å. It will be understood that the formation of the base electrode 19 on such a thin base layer 14 via the contact hole in the insulation film 17 without damaging the base layer 14 is extremely difficult. When the electrode 19 penetrates through the base layer 14, the base and the collector of the transistor are shorted and the device no longer operates properly. Thus, the fabrication of the device of FIG. 1 in the production line has been unsuccessful.

In order to avoid the above problem of fabrication, various structures are proposed. For example, Capasso et al. proposed a so-called quantum well base transistor wherein the double potential wall quantum well structure is formed in a part of a thick base layer for controlling the flow of electrons through the conduction band of the base layer (Capasso, F., Kiehl, R. A. "Resonant Tunneling Transistor with Quantum Well Base and High-energy Injection," J. Appl. Phys., 58 p.1366, 1985). Further, Yokoyama et al. (op. cit.) proposed the RHET device as described before.

In any of these conventional devices, the control of the flow of the carriers is made electrically by controlling the potential level of the base region via electric means. On the other hand, it is thought that the control of the quantum effect semiconductor devices via optical means would provide the possibility of using these devices in the optical processing devices or future optical computers. When such a device is realized, it will open a new field of application of the resonant-tunneling transistors.

SUMMARY OF THE INVENTION

Accordingly, it is a general object of the present invention to provide a novel and useful resonant-tunneling transistor, wherein the foregoing problems are eliminated.

Another and more specific object of the present invention is to provide an optically activated resonant-tunneling transistor that is operated in response to irradiation by an optical beam.

Another object of the present invention is to provide a resonant-tunneling transistor wherein the base electrode is eliminated.

Another object of the present invention is to provide a resonant-tunneling transistor that is easy to fabricate.

Another object of the present invention is to provide a resonant-tunneling transistor, comprising: an emitter layer for releasing electrons, a base layer provided adjacent to the emitter layer for passing the electrons selectively by a resonant-tunneling effect, and a collector layer provided adjacent to the base layer at a side opposite to the emitter layer for collecting the electrons passed through the base layer, wherein the base layer includes a potential well of holes formed adjacent to the emitter layer and a quantum well of electrons formed adjacent to the collector layer, and there is provided a window for introducing optical excitation into the collector layer. In operation, holes are excited in the valence band of the collector layer in response to the optical excitation. Under a suitable bias voltage applied across the emitter layer and the collector layer, the holes thus excited in the collector layer are transported in the direction of the emitter layer in response to the electric field induced by the bias voltage and eventually fall into the potential well in the base layer. Thereby, an accumulation of holes occurs in the potential well and the potential level of the base layer changes in response thereto. When the quantum level of the electrons in the quantum well in the base layer coincides with the Fermi level in the emitter layer, there occurs the resonant-tunneling of the electrons from the emitter layer to the collector layer. According to the present invention, the conventional electric control of the resonant-tunneling of electrons is replaced by the optical control and one can eliminate the base electrode from the resonant-tunneling transistor. Thereby, the fabrication of the transistor becomes substantially easier and the device is suited for mass production with reduced cost. Further, the optically controlled device of the present invention is suited for use in optical information processing systems such as optical computers of the future.

Other objects and further features of the present invention will become apparent from the following detailed description when read in conjunction with the attached drawings.

DETAILED DESCRIPTION

Figure 1:
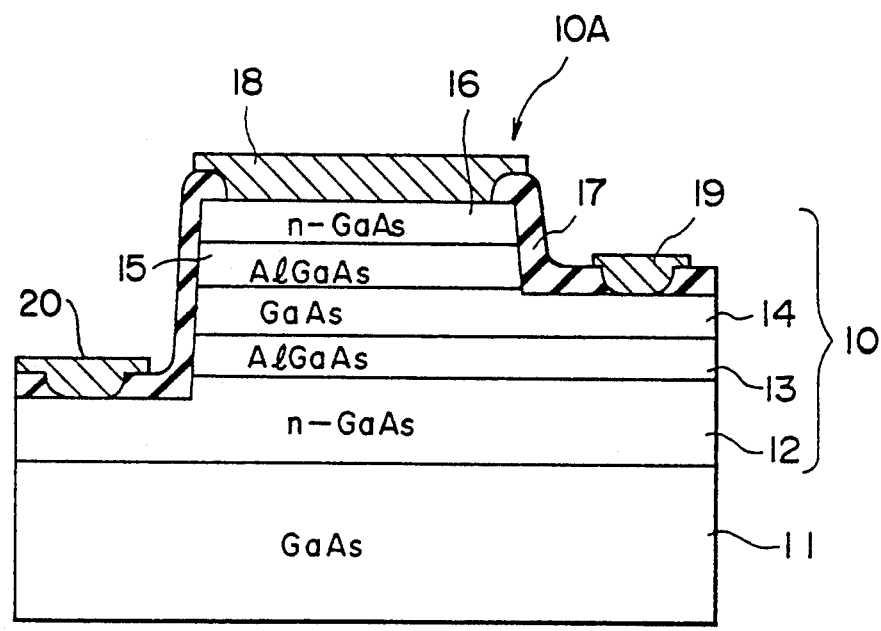
FIG. 1 is a cross sectional view of a conventional resonant-tunneling transistor.
Figure 2:
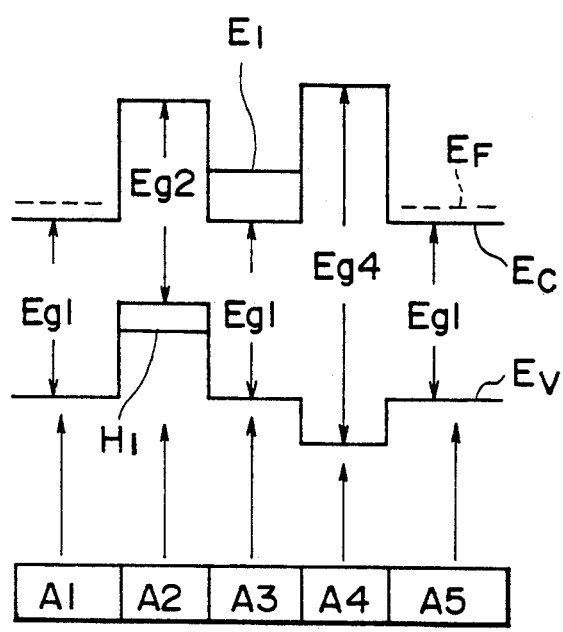
FIG. 2 is a band diagram showing the principle of the resonant-tunneling transistor of the present invention.

FIG. 2 shows the band diagram of the resonant-tunneling transistor according to a first embodiment of the present invention.

Referring to FIG. 2, the transistor of the present embodiment includes a first material layer A1 that acts as an emitter of the transistor. Thus, the material layer A1 will be referred to hereinafter as the emitter layer A1. The emitter layer A1 has a first band gap Eg1, and a second material layer A2 having a band gap of Eg2 is provided adjacent to the layer A1. Thereby, there is formed a so-called Type-II heterojunction or staggered type heterojunction between the emitter layer A1 and the material layer A2. It should be noted that the material layer A2 acts as a barrier against the electrons on the conduction band Ec that are injected from the emitter layer A1.

Adjacent to the material layer A2, there is provided a third material layer A3 having a third band gap that is equal to the band gap Eg1 at the side opposite to the side where the emitter layer A1 is provided. The material layer A3 may be formed of the same material as the emitter layer A1, and thus, there is formed the staggered type heterojunction interface also between the material layer A2 and the material layer A3. As a result of the layered structure of the material layers A1–A3, it should be noted that there is formed a potential well of holes in the valence band Ev of the material layer A2, wherein a quantum state H1 of holes is formed as illustrated. Because of this reason, the material layer A2 will be referred to hereinafter as a barrier/well layer.

Further, a fourth material layer A4 is provided adjacent to the layer A3 with a band gap Eg4 that is much larger than any of the band gaps Eg1 and Eg2. Thereby, a potential well of electrons is formed in the conduction band Ec of the layer A3, sandwiched by the potential barriers formed in the conduction band Ec of the material layers A2 and A4. In the potential well, there is formed a quantum state E1 for the electrons as illustrated. Thus, the layer A3 will be referred to as a quantum well layer while the material layer A4 will be referred to as a barrier layer.

Adjacent to the barrier layer A4, there is provided a fifth material layer A5 with a fifth band gap equal to Eg1 as the collector of the transistor. Thus, the layer A5 will be referred to hereinafter as the collector layer. As usual, the collector layer A5 collects the electrons that have been injected by the emitter layer A1 and passed through the material layers A2–A4.

As already noted, the resonant-tunneling transistor includes the potential well for the holes characterized by the quantum state H1 in the barrier/well layer A2 and the potential well for the electrons characterized by the quantum state E1 in the quantum well layer A3. Further, the thickness of the layers A2 and A4 is made small enough that the electrons can pass freely through the potential barrier formed in the conduction band Ec. Thereby, the layers A2–A4 form a base structure of the transistor.

In the transistor of FIG. 2, one can observe the resonant-tunneling of electrons from the emitter layer A1 to the collector layer A5 via the potential barriers when one can lower the potential level of the base structure such that the energy level of the quantum state E1 coincides with the Fermi level $E_F$ of the emitter layer A1. Conventionally, such a change of the potential level of the base structure has been achieved by applying a base voltage to the base structure. As already mentioned, such a control of the potential of the base structure via the base electrode has been difficult.

In the present invention, the potential level of the base structure and hence the energy level of the quantum state E1 is controlled by creating holes by optical excitation and accumulating the same in the potential well of the barrier/well layer A2. Thereby, the collector layer A5 is irradiated by an optical beam having an energy exceeding the band gap Eg1 under the state that the emitter layer A1 is applied with a negative bias voltage and the collector layer A5 is applied with a positive bias voltage. As a result, the electrons that have been injected by the emitter layer A1 pass through the potential barriers in the layers A2 and A4 by tunneling, as well as through the quantum well layer A3 by resonant-tunneling, and reach the collector layer A5. The electrons that are formed in the conduction band Ec of the collector layer A5 as a result of the optical excitation immediately escape to the collector electrode (not illustrated in FIG. 2). On the other hand, the holes that are formed in the collector layer A5 as a result of the optical excitation are transported toward the emitter layer by the electric field established between the emitter layer A1 and the collector layer A5 and fall into the potential well in the barrier/well layer A2. The operation of the device will be described later in detail with reference to the band diagrams in FIGS. 4(A) and 4(B).

Figure 3:
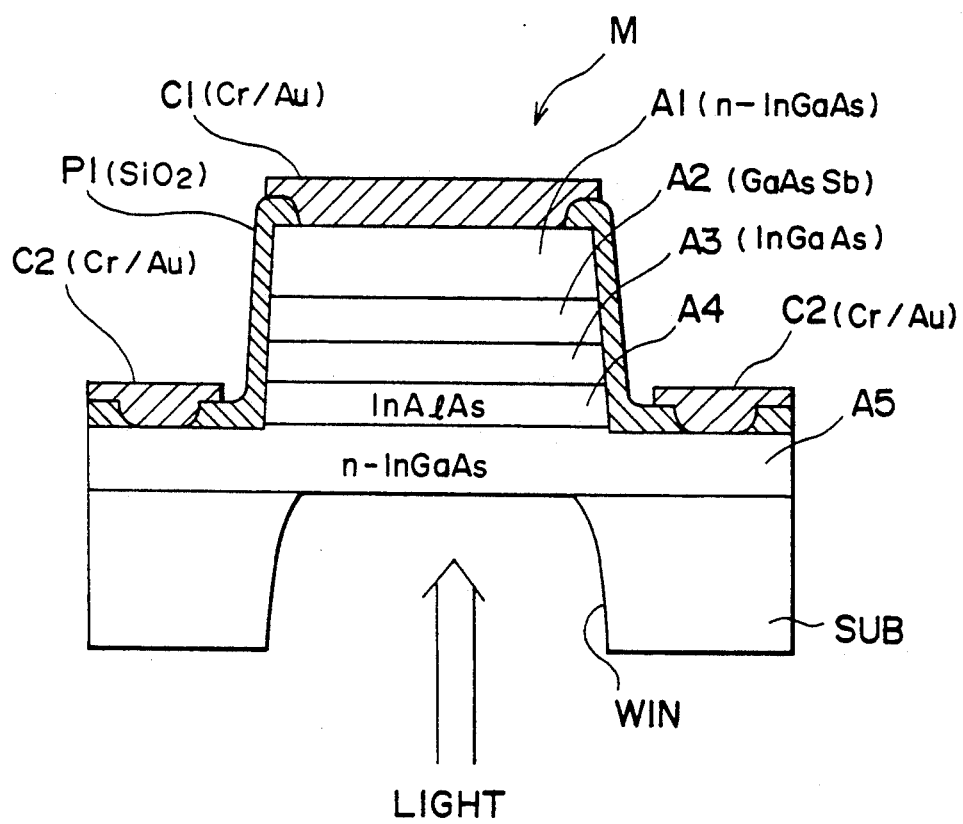
FIG. 3 is a cross sectional view of the resonant-tunneling transistor according to a first embodiment of the present invention.

FIG. 3 shows the structure of the resonant-tunneling transistor of the first embodiment in the cross sectional view.

Referring to FIG. 3, the device is constructed on a substrate SUB of semi-insulating InP, and includes the collector layer A5 of n-type InGaAs that has a composition of $In_{0.53}Ga_{0.47}As$ for achieving lattice matching with the InP substrate. The collector layer A5 is doped at a carrier density of $1 \times 10^{17}$ cm$^{-2}$ and has a thickness of about 200 nm.

On the collector layer A5, the barrier layer A4 of undoped InAlAs has a thickness of 5.27 nm. The layer A4 has a composition of $In_{0.52}Al_{0.48}As$ for achieving lattice matching, and forms the potential barrier in the conduction band Ec. The barrier layer A4 also forms a barrier against the holes in the valence band Ev. This barrier, however, has a modest barrier height of about 0.2 eV and the holes pass through the layer A4 easily by tunneling. It should be noted that the layer A4 has the extremely reduced thickness.

On the barrier layer A4, the quantum well layer A3 of undoped InGaAs is provided with a thickness of 4.4 nm. This layer A3, too, has the composition of $In_{0.53}Ga_{0.47}As$ and achieves lattice matching with the underlying InP substrate SUB. Further, the barrier/well layer A2 of GaAsSb, provided on the fourth material layer A4, has a composition of $GaAs_{0.49}Sb_{0.51}$ and a thickness of 8.5 nm. As described previously, this material for the layer A2 forms the staggered type heterojunction with the material layer A3 and forms the potential barrier in the conduction band Ec and simultaneously the potential well in the valence band Ev. Further, the emitter layer A1 of n-type InGaAs, provided on the barrier/well layer A2, has a composition of $In_{0.53}Ga_{0.47}As$ and a thickness of about 200 nm. Similar to the collector layer A5, the emitter layer A1 is doped with the carrier density of $1 \times 10^{17}$ cm$^{-3}$.

As shown in FIG. 3, the material layers A1–A5 form a mesa structure M such that the upper major surface of the collector layer A5 is exposed. Further, the exposed upper major surface of the collector layer A5 as well as the side wall of the mesa structure M are covered by a passivation film P1 of silicon oxide with a thickness of 250 nm, and an emitter electrode C1 is provided in ohmic contact with the upper major surface of the emitter layer A5 via a contact hole formed in the passivation film P1. In correspondence to the upper major surface of the collector layer A5, a collector electrode C2 is provided similarly in ohmic contact via a contact hole that is provided in the passivation film P1. It should be noted that both the emitter electrode C1 and the collector electrode C2 have a structure including a stack of a chromium layer and a gold layer respectively with thicknesses of 20 nm and 200 nm and establish the ohmic contact with the underlying semiconductor layer.

Further, a window WIN is provided on the substrate SUB to expose the lower major surface of the collector layer A5. Thereby, the optical beam that excites the holes in the collector layer A5 is introduced from the bottom of the device through the window WIN.

Figure 4A:
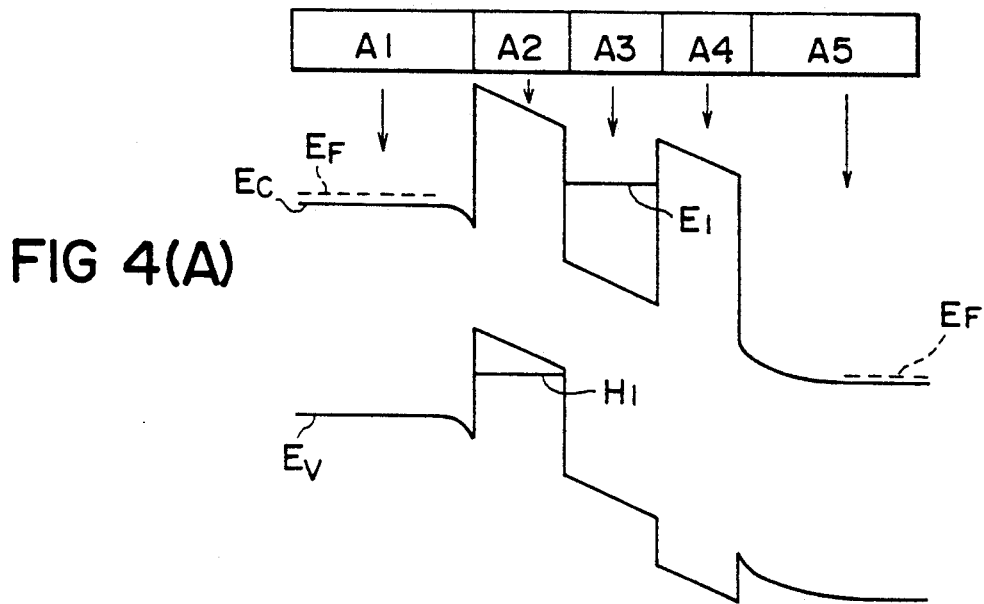
FIGS. 4(A) and 4(B) are diagrams respectively showing the band diagrams of the resonant-tunneling transistor of FIG. 3 in an operational state.
Figure 4B:
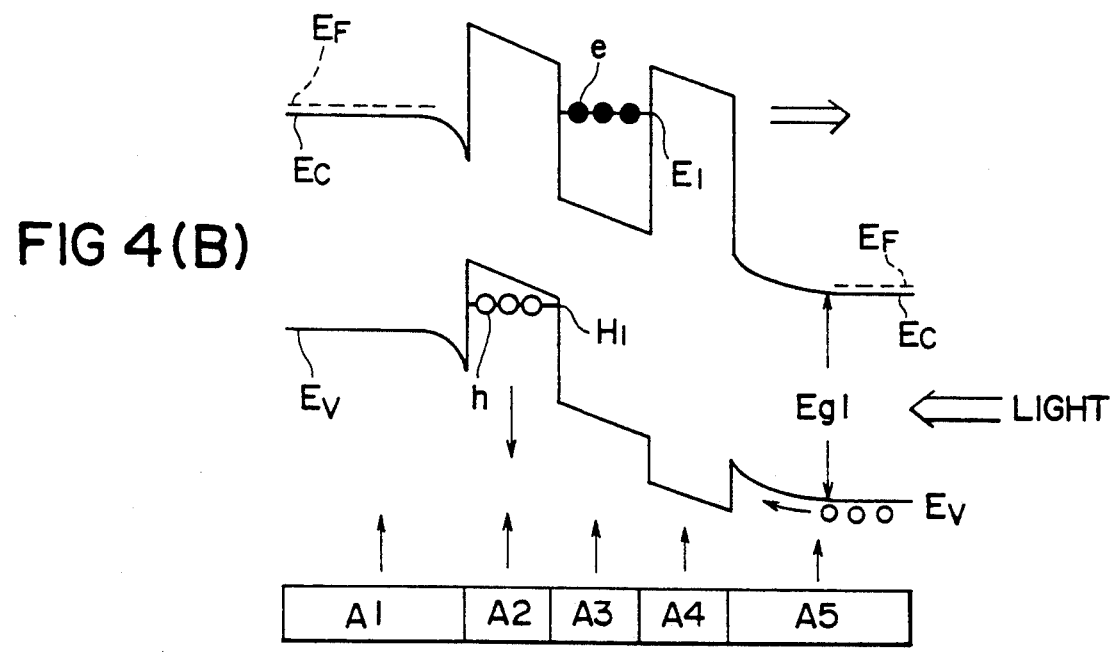

FIGS. 4(A) and 4(B) show the band diagram of the device of FIG. 3 in the operational state in which a bias voltage is applied across the collector layer A1 and the emitter layer A5. FIG. 4(A) shows the state in which the device is not illuminated by the optical beam while FIG. 4(B) shows the state in which the device is illuminated by the optical beam.

As shown in FIG. 4(A), the band diagram is deformed as usual upon the application of a negative voltage to the collector electrode C2 and a positive voltage to the emitter electrode C1. Thereby, there is formed a slope in the conduction band Ec that urges the electrons in the emitter layer A1 to flow into the collector layer A5. This flow of the electrons, however, is prevented by the layers A2–A4, as the quantum level E1 in the material layer A3 is deviated from the Fermi level $E_F$ in the emitter layer A1. In this condition, the resonant-tunneling of the electrons does not occur and the device is turned off.

When the optical beam having an energy exceeding the band gap Eg1 is irradiated onto the collector layer A5 as shown in FIG. 4(B), holes are created in the valence band Ev of the layer A5 as a result of the optical energization, and these holes move toward the emitter layer A1 along the slope of the valence band Ev. There, the holes pass through the modest barrier in the valence band of the barrier layer A4 and fall into the potential well in the barrier/well layer A2 after passing through the quantum well layer A3 along the valence band Ev.

The holes that have fallen into the potential well are accumulated on the quantum state H1, and such an accumulation of the holes lowers the potential level of the barrier/well layer A2 as shown by an arrow in FIG. 4(B). In response to this, the potential level of the quantum well layer A3 is lowered, and the Fermi level $E_F$ of the emitter layer A1 ultimately coincides with the quantum level E1 in the quantum well layer A3. There, the resonant-tunneling of the electrons occurs and the electrons at the Fermi level $E_F$ of the emitter layer A1 pass through the quantum well layer A3 and exit to the collector layer A5. This corresponds to the turning-on of the resonant-tunneling transistor. As noted previously, the barrier layers A2 and A4 that sandwich the material layer A3 and form the potential barrier in the conduction band Ec, pass the electrons therethrough freely by the tunneling.

In the state of FIG. 4(A) in which the device is not illuminated, one can of course establish the condition of resonant-tunneling by suitably choosing the bias voltage across the collector layer A5 and the emitter layer A1. The principle of operation of the device of the present invention exists in the point that this resonant-tunneling condition can be modified in response to the optical excitation of the holes. Thus, when the resonant-tunneling is achieved in the absence of the optical excitation, the device is turned off in response to the optical excitation. Further, when the resonant-tunneling is not achieved in the absence of the optical excitation, the device can be turned on in response to the optical excitation.

Figure 5:
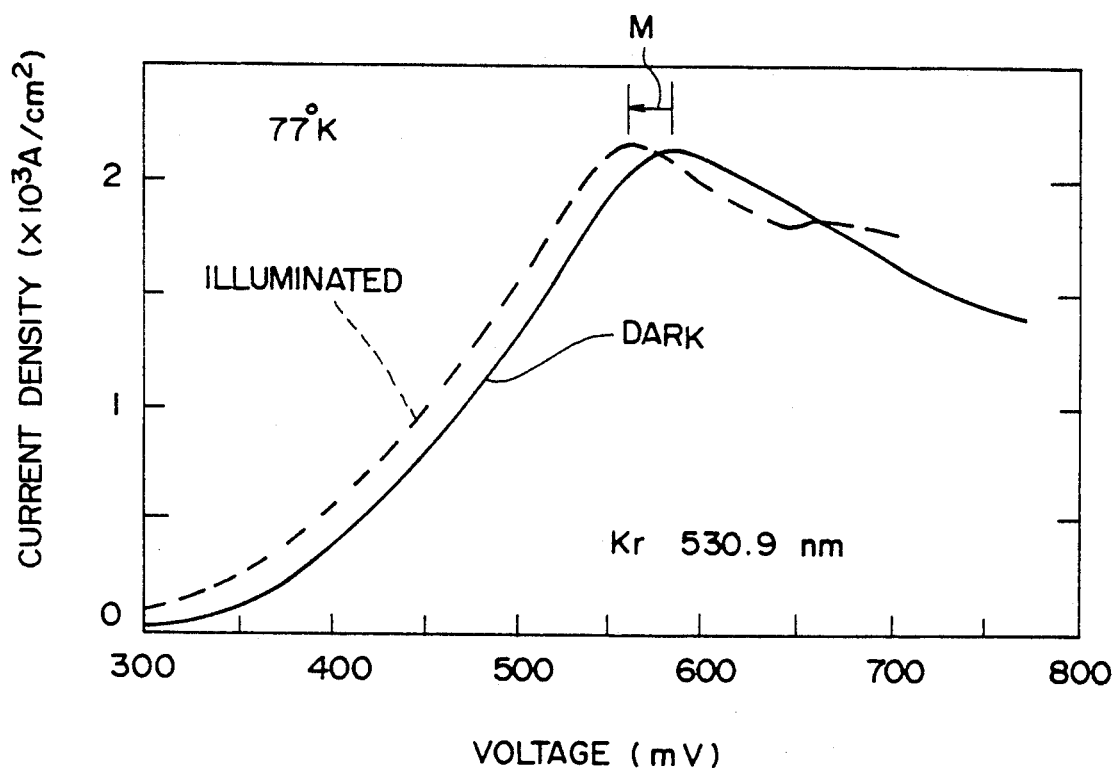
FIG. 5 is a diagram showing the operating characteristics of the transistor of FIG. 3 at 77° K.

FIG. 5 shows the operational characteristics of the device of FIG. 3 measured at 77 K. In the experiment, a radiation from Krypton at the wavelength of 530.9 nm was used for exciting the holes. In FIG. 5, the abscissa represents the voltage applied across the collector electrode C1 and the emitter electrode C2 while the ordinate represents the current density of the observed collector current. The experiment was conducted on a device having a size of 20 $\mu$m × 20 $\mu$m. The continuous line in FIG. 5 represents the result of an experiment conducted in a dark environment while the broken line represents the result in an illuminated environment.

Referring to FIG. 5, it will be seen that the output collector current shows a peak in correspondence to the collector-emitter voltage that provides the resonant-tunneling of electrons, wherein the voltage corresponding to the maximum output current shifts in response to the irradiation of the optical beam.

Figure 6:
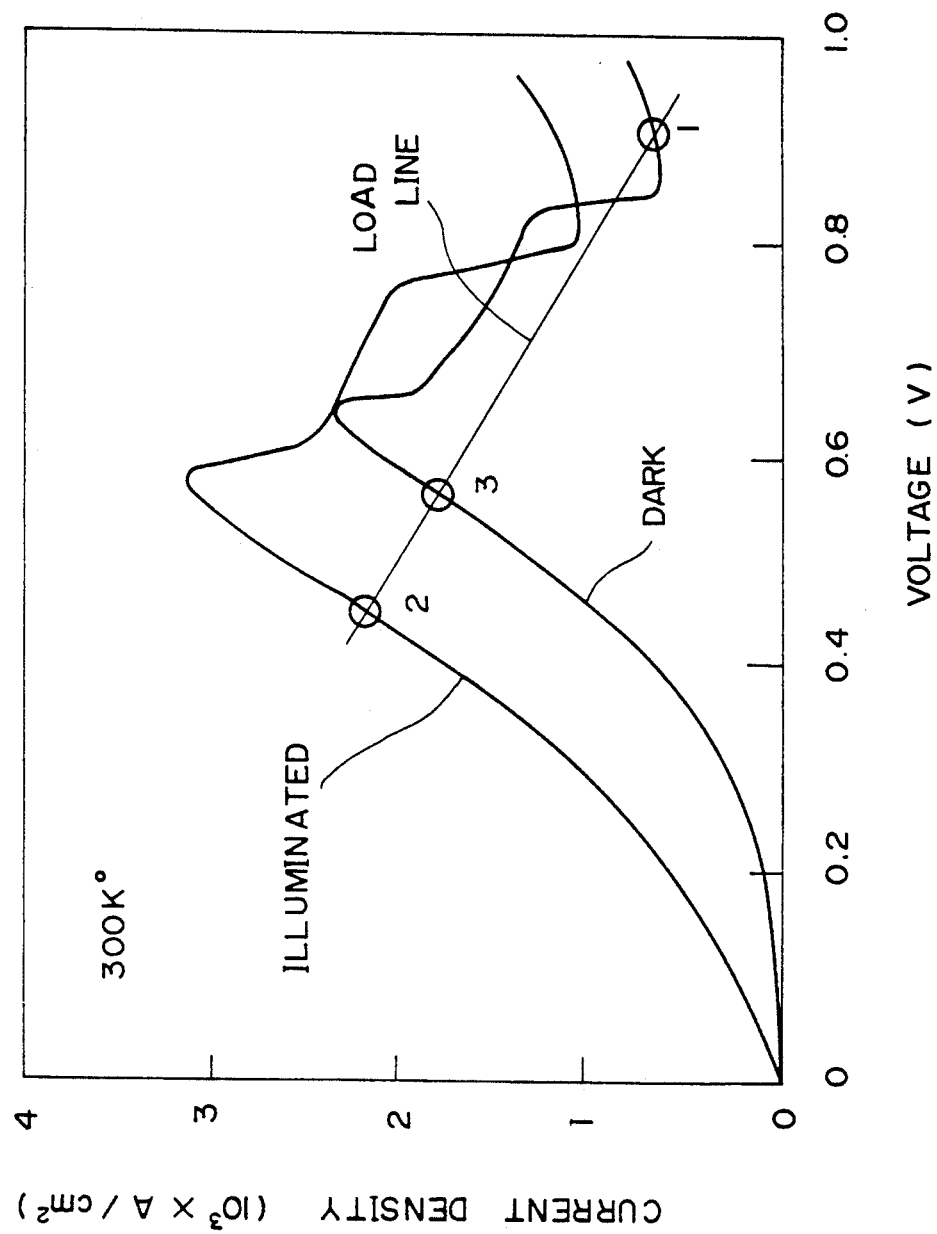
FIG. 6 is a diagram similar to FIG. 5 showing the operating characteristics at 300° K together with a load line.

FIG. 6 shows the result of the same experiment conducted at 300 K. As can be seen, the shift of the peak is even more enhanced in this experiment. Further, FIG. 6 shows the load line in superposition to the characteristic curve.

Referring to FIG. 6, it can be seen that the device has three stable operational points 1, 2 and 3, wherein the operational points 1 and 3 are located on the characteristic curve for the dark environment and the operational point 2 is located on the characteristic curve for the illuminated environment. Thus, the device shows a bistable operation in the dark environment at the operational point 1 and at the operational point 3, wherein the transition of the operational point from the point 1 to the point 3 can be achieved via the operational point 2 for the illuminated environment. The application of this operational characteristics will be described later with reference to FIG. 13.

Figure 7:
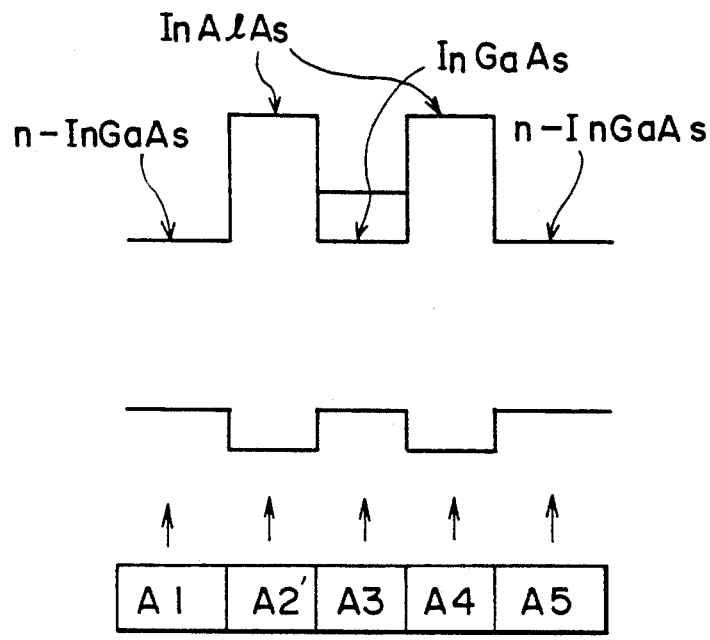
FIG. 7 is a band diagram of a device that is fabricated as a reference for comparison with the device of the present invention.

FIG. 7 shows the band diagram of a semiconductor device fabricated for comparison with the device of the present invention. In this device, the barrier/well layer A2 is replaced by a material layer A2' of undoped InAlAs. Thereby, the staggered type heterojunction is no longer formed at the interface between the layer A1 and the layer A2' or between the layer A3 and the layer A2'. The heterojunction formed between the layer A1 and the layer A2' or between the layer A2' and the layer A3 is known as the Type-I heterojunction characterized by the potential barrier both in the valence band and the conduction band.

Figure 8:
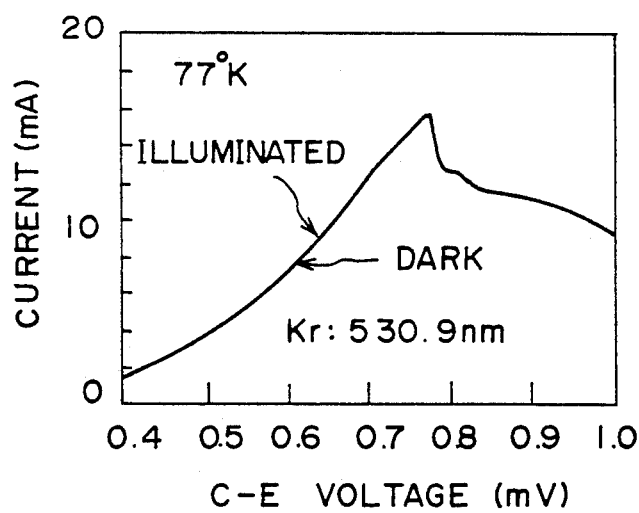
FIG. 8 is a diagram showing the operating characteristics of the device of FIG. 7.

FIG. 8 shows the operational characteristics of the device of FIG. 7 measured at 77 K in conditions identical with the conditions of the experiment of FIG. 5. As can be seen in FIG. 8, this device shows the same characteristic curve in the dark environment and in the illuminated environment, and the shift of the peak as in FIG. 5 is not observed. This clearly indicates that the shift of the characteristic curve observed in the device of the present invention is attributed to the accumulation of the holes in the potential well formed in the valence band of the barrier/well layer A2.

Figure 9:
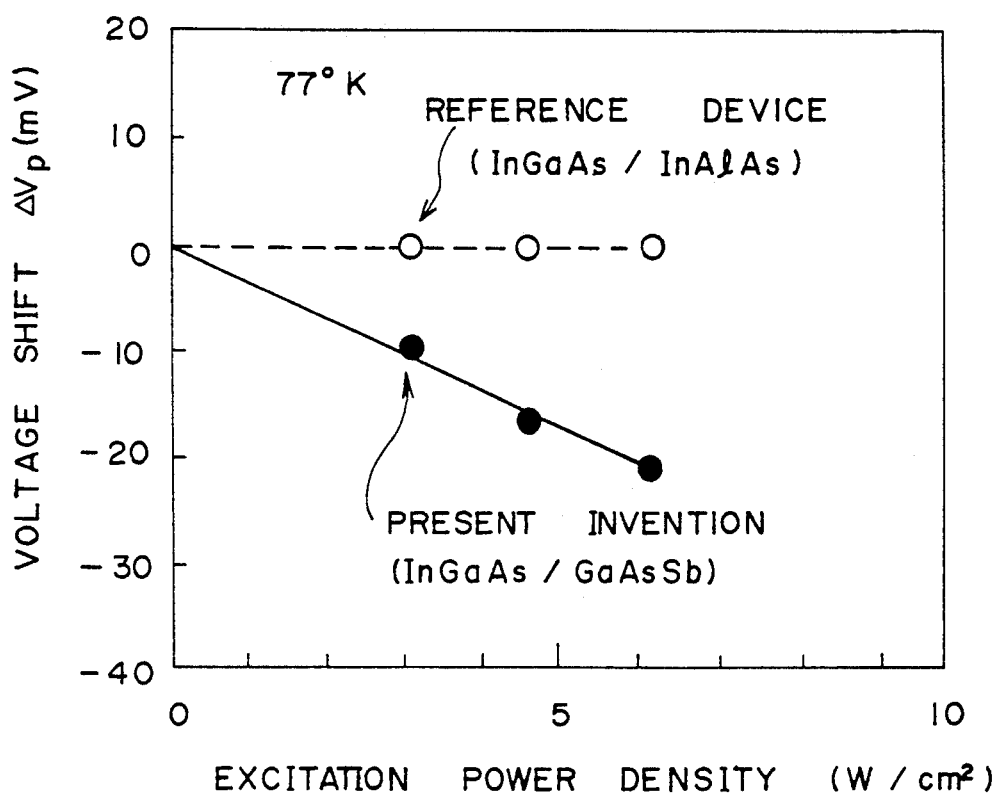
FIG. 9 is a diagram showing the relationship between the voltage that provides the maximum current and the power density of the excitation optical beam obtained at 77° K.

FIG. 9 shows the relationship between the shift of the peak of the characteristic curve observed at 77 K and the power of the optical beam that was used for exciting the holes. As can be seen clearly in FIG. 9, the magnitude of the shift, measured in terms of the collector-emitter voltage that provides the maximum, increases with increasing optical power. When the device of the present invention is used in combination of the optical power of 5 W/cm² or more, a shift of as much as −20 mV can be achieved. On the other hand, the device of FIG. 7 does not show such a shift of the characteristics at all.

Figure 10:
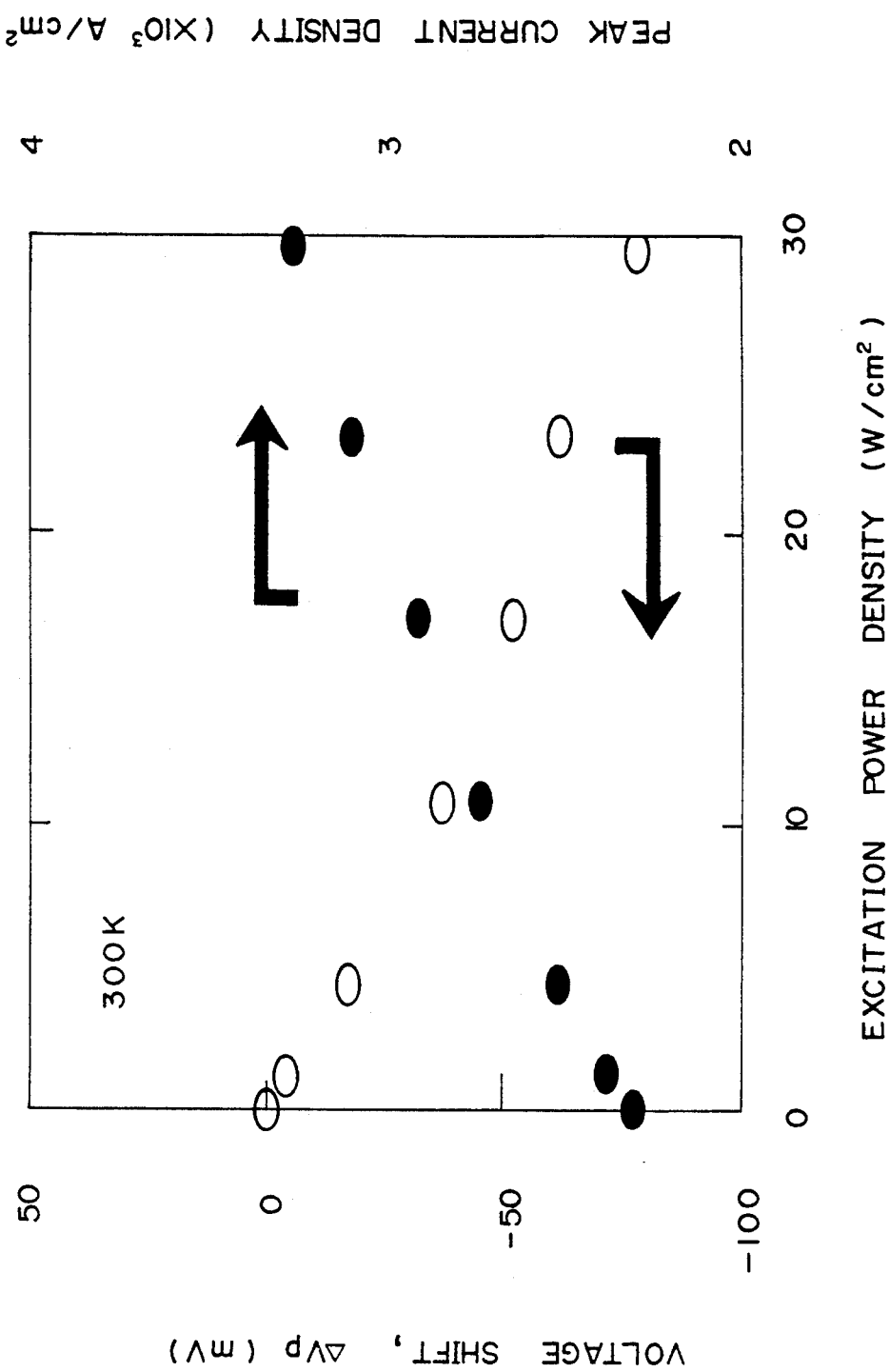
FIG. 10 is a diagram showing the relationship between the voltage that provides the maximum current and the power density of the excitation optical beam obtained at 300° K, together with the relationship between the peak current density and the power density.

FIG. 10 shows the shift of the characteristic curve observed at 300 K. In FIG. 10, the ordinate at the left shows the shift represented in terms of the voltage corresponding to the maximum of the characteristic curve, while the ordinate at the right shows the peak current density. As shown in FIG. 10, one can obtain a shift similar to that of FIG. 9, the magnitude of which exceeds 50 mV upon irradiation by an optical beam having a power of 20 W/cm² or more.

Next, the fabrication process of the device of FIG. 3 will be described. As the processes used for fabricating the present device are more or less common with the processes used for fabricating the RHET, only a schematic description will be given below.

First, the layers A1–A5 are grown consecutively on the semi-insulating InP substrate SUB by the MBE process in the respective thickness described previously. During the epitaxial growth, the emitter layer A1 and the collector layer A5 are doped to a carrier concentration level of 1×10¹⁷ cm⁻³ as described previously, by introducing dopants such as silicon simultaneously into the molecular beam.

Next, the layered body thus obtained is subjected to an etching process to form the mesa structure M. Thereby, the upper major surface of the collector layer A5 is exposed. Further, the passivation film P1 of silicon oxide is deposited on the entire surface of the layered semiconductor body thus obtained, including the exposed upper major surface of the collector layer A5, the side wall of the mesa structure M and the upper major surface of the emitter layer A1 at the top part of the mesa structure M, by the CVD process.

Further, contact holes are provided in correspondence to the upper major surface of the emitter layer A1 and the upper major surface of the collector layer A5, and the emitter electrode C1 and the collector electrode C2 are provided respectively in contact with the emitter layer A1 and the collector layer A5. Finally, the window WIN is provided by etching the substrate SUB from the lower surface thereof until the lower surface of the collector layer A5 is exposed.

Figure 11:
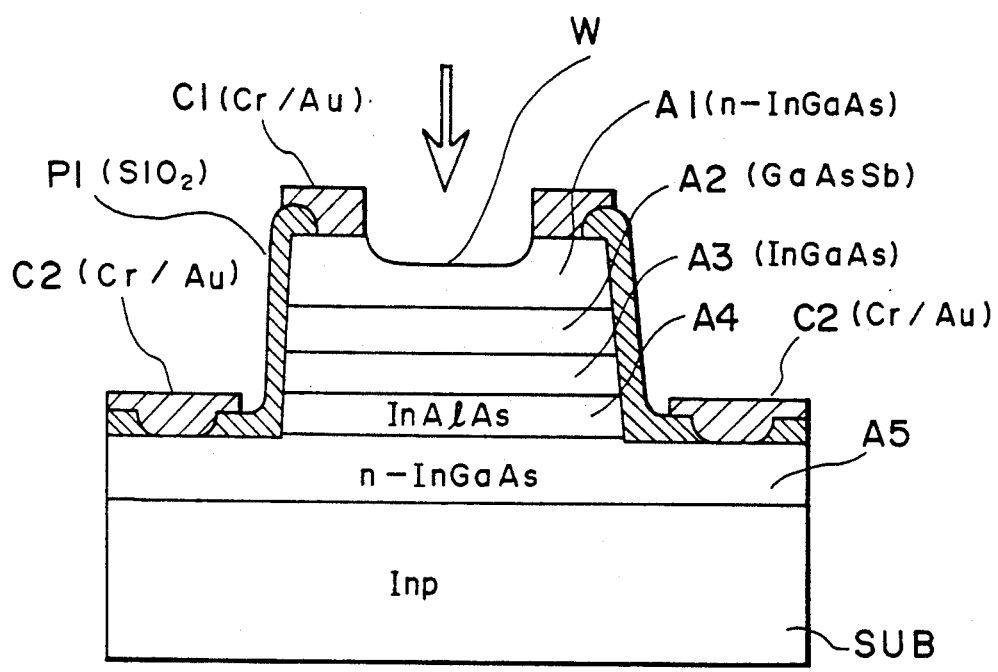
FIG. 11 is a cross-sectional view of a modification of the transistor of FIG. 3.

FIG. 11 shows a modification of the device of FIG. 3. In FIG. 11, the parts that correspond to the parts shown in FIG. 3 are designated by the same reference numerals and the description thereof will be omitted.

In this structure, a window W is provided in the emitter electrode C1 to expose the upper major surface of the emitter layer A1. Further, the upper major surface of the layer A1 is grooved such that the thickness of the emitter layer A1 is reduced in correspondence to the window W. As a result of reduction in the thickness of the layer A1, one can avoid the unwanted absorption of the optical beam in the emitter layer A1. Thereby, the incident optical beam mainly causes the excitation in the collector layer A5 and the device operates similar to the device of FIG. 3.

Figure 12:
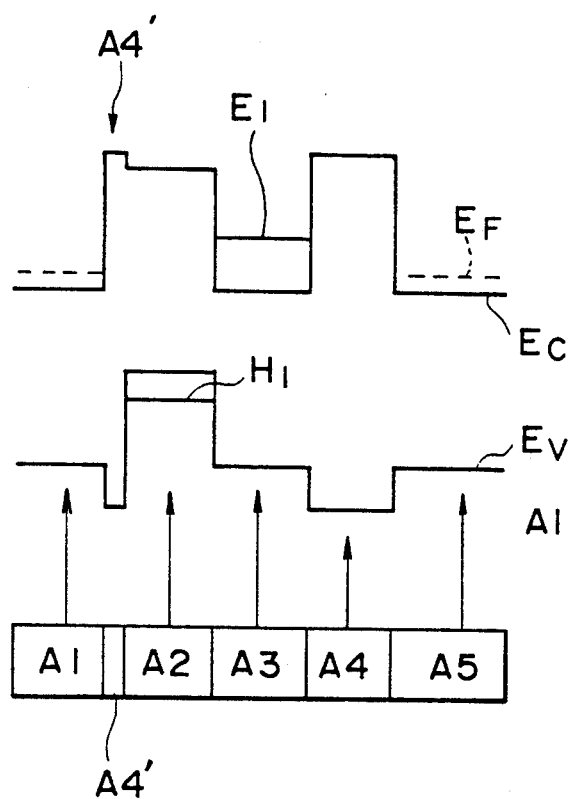
FIG. 12 is a band diagram of a second embodiment of the present invention.

FIG. 12 shows a second embodiment of the present invention, wherein a spacer layer A4' is interposed between the emitter layer A1 and the barrier/well material layer A2. This spacer layer A4' separates the emitter layer A1 and the barrier/well layer A2 from each other, and retards the recombination of the holes accumulated in the potential well of the layer A2 and the electrons in the layer A1. Thereby, the efficiency of lowering the potential level of the quantum state E1 in the layer A3 is improved and the optical control of the resonant-tunneling of electrons is facilitated. As the spacer layer A4', one may use the material identical in composition with the material layer A4. Thus, InAlAs with the composition of $In_{0.52}Al_{0.48}As$ may be used for the spacer layer A4'. Alternatively, InP may be used for the spacer layer A4', wherein $In_{0.52}Al_{0.48}As$ is preferred from the view point of lattice matching and reducing the reflection of electrons by the barrier in the conduction band Ec. It should be noted that InAlAs with the foregoing composition forms a barrier of 0.53 eV in the conduction band that is approximately equal to the barrier height formed by the material layer A2.

The thickness of the spacer layer A4' should be set such that the overall thickness of the layer A2 and the layer A4' is small enough to allow the free tunneling of the electrons through the layers A2 and A4'. Preferably, the thickness of the layer A4' is set smaller than bout 5 nm.

Figure 13:
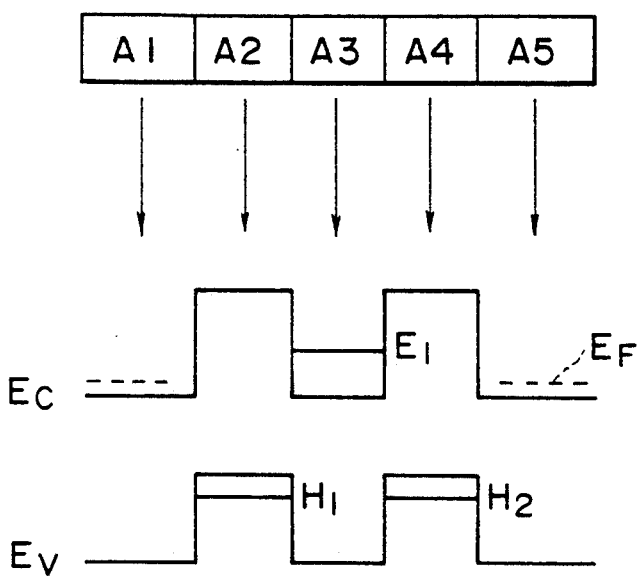
FIG. 13 is a band diagram of a third embodiment of the present invention.

FIG. 13 shows the band diagram of a third embodiment of the present invention. In FIG. 13, those parts that correspond to the parts described already with reference to previous drawings are designated by the same reference numerals and the description thereof will be omitted.

In the present embodiment, the barrier layer A4 is replaced by GaAsSb with the composition and thickness identical to those of the barrier/well layer A2. Thereby, there is formed a second potential well of holes in the valence band Ev of the layer A4, and a second quantum state H2 is formed in the potential well thus formed. Thus, in this structure, both of the layers A2 and A4 act as the potential barrier to the electrons on the conduction band Ec and simultaneously as the potential well against the holes on the valence band Ev. Thereby, the holes that are created in response to the irradiation of the optical beam are accumulated in the quantum states H1 and H2 in the layers A2 and A4, and the deformation of the band structure that ultimately leads to the resonant-tunneling of electrons in the conduction band Ec is induced.

Apart from the foregoing compositions for the layers A1–A5, various other compositions may be employed for the structure of FIG. 13, as long as there is a lattice matching achieved against the substrate and there is formed the Type-II heterojunction interface between the emitter layer A1 and the barrier/well layer A2. For example, InP may be used for the emitter layer A1, the quantum well layer A3, and the collector layer A5, while InAlAs may be used for the barrier/well layers A2 and A4. Alternatively, AlAsSb may be used for the barrier/well layers A2 and A4. The composition of the barrier/well layers A2 and A4 is adjusted to establish the desired lattice matching against the InP substrate.

Figure 14:
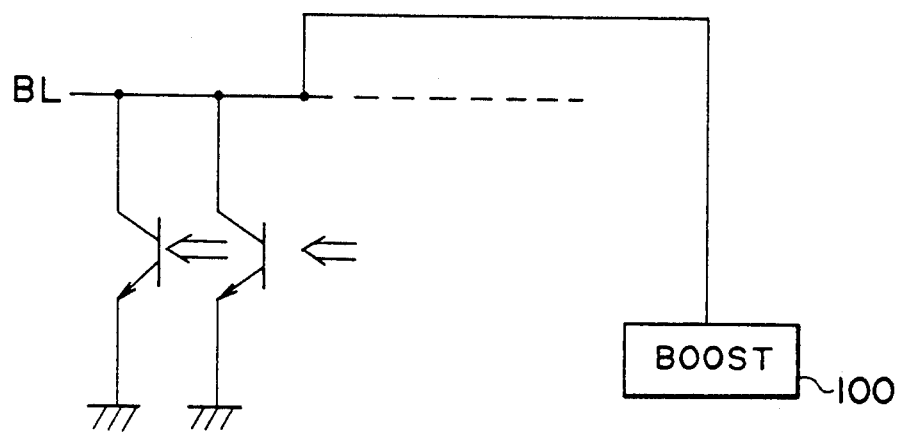
FIG. 14 is a circuit diagram showing an application of the device of FIG. 3.

FIG. 14 shows an example of application of the resonant-tunneling transistor of the present invention to a memory device.

Referring to FIG. 14, plural resonant-tunneling transistors of the present invention are connected in parallel to a bit line BL and activated individually in response to irradiation by an optical beam. It should be noted that there are a number of such bit lines BL to which the resonant-tunneling transistors are connected.

In response to the irradiation by the optical beam, the operational point of the transistor moves from the point 1 of FIG. 6 to the point 2 that is located on the characteristic curve for the illuminated environment. After turning off of the optical beam, the operational point moves further from the point 2 to the point 3. There, the transistor shows a bistable operation and the memory device of FIG. 14 acts as a memory device. In order to restore the initial state, a voltage of about 1 volt is applied to the bit line by a boost circuit 100. Thereby, the state of the device returns to the initial state. In other words, the device operates as an optically-written, electrically erasable memory device.

Further the present invention is not limited to the embodiments described heretofore, but various variations and modifications may be made without departing from the scope of the invention.

What is claimed is:

1. A resonant-tunneling transistor activated in response to an optical beam having a predetermined energy level, comprising:

a first semiconductor layer having upper and lower major surfaces and acting as a collector for collecting electrons, said first semiconductor layer being doped to an n-type and having a conduction band and a valence band at respective, different energy levels, said conduction band and said valence band being separated from each other by an energy band gap equal to or smaller than the predetermined energy level of the optical beam;

a second semiconductor layer having upper and lower major surfaces and provided on the upper major surface of the first semiconductor layer, said second semiconductor layer having a conduction band at an energy level higher than the energy level of the conduction band of the first semiconductor layer and forming a potential barrier of electrons, said second semiconductor layer having a thickness selected to allow tunneling of the electrons therethrough;

a third semiconductor layer having upper and lower major surfaces and provided on the upper major surface of the second semiconductor layer, said third semiconductor layer having a conduction band and a valence band, said conduction band having an energy level lower than the energy level of the conduction band of the second semiconductor layer, said third semiconductor layer having a thickness selected to form an electron quantum well in the conduction band of the third semiconductor layer;

a fourth semiconductor layer having upper and lower major surfaces and provided on the upper major surface of the third semiconductor layer, said fourth semiconductor layer having a conduction band and a valence band, said conduction band of the fourth semiconductor layer having an energy level higher than the energy level of the conduction band of the third semiconductor layer and forming a potential barrier of electrons, said valence band of the fourth semiconductor layer having an energy level higher than the energy level of the valence band of the third semiconductor layer and forming a hole quantum well in which holes are accumulated, said fourth semiconductor layer having a thickness selected to allow tunneling of the electrons therethrough;

a fifth semiconductor layer having upper and lower major surfaces and provided on the upper major surface of the fourth semiconductor layer, said fifth semiconductor being doped to the n-type and acting as an emitter for injecting electrons, said fifth semiconductor layer having a conduction band of an energy level lower than the energy level of the conduction band of the fourth semiconductor layer, and having a valence band of an energy level lower than the energy level of the valence band of the fourth semiconductor layer;

first electrode means provided in contact with the first semiconductor layer for recovering electrons therefrom;

second electrode means provided in contact with the fifth semiconductor layer for injecting electrons thereto; and means for defining an optical passageway for irradiating the optical beam onto said first semiconductor layer.

2. A resonant-tunneling transistor as claimed in claim 1, in which said first, third and fifth semiconductor layers are formed of a common semiconductor material.

3. A resonant-tunneling transistor as claimed in claim 2, in which said common semiconductor material comprises InGaAs, said second semiconductor layer comprises InAlAs, and said fourth semiconductor layer comprises GaAsSb.

4. A resonant-tunneling transistor as claimed in claim 3, in which said transistor further comprises a substrate of InP having upper and lower major surfaces and provided under the lower major surface of the first semiconductor layer, said first through fifth semiconductor layer having respective compositions selected to establish lattice matching to the substrate.

5. A resonant-tunneling transistor as claimed in claim 4, in which said first, third and fifth semiconductor layers have a composition of $In_{0.53}Ga_{0.47}As$, said second semiconductor layer has a composition of $In_{0.52}Al_{0.48}As$, and said fourth semiconductor layer has a composition of $GaAs_{0.49}Sb_{0.51}$.

6. A resonant-tunneling transistor as claimed in claim 1, further comprising a window on the lower major surface of the substrate through which the lower major surface of the first semiconductor layer is exposed.

7. A resonant-tunneling transistor as claimed in claim 6, in which said second through fifth semiconductor layers comprise a mesa structure on the upper major surface of the first semiconductor layer, a part of the upper major surface of the first semiconductor layer being covered by the mesa structure and another part of the upper major surface of the first semiconductor layer being exposed, said first electrode means comprising an ohmic electrode in contact with the exposed part of the upper major surface of the first semiconductor layer.

8. A resonant-tunneling transistor as claimed in claim 1, in which said second electrode means comprises an ohmic electrode in contact with the upper major surface of the fifth semiconductor layer, and said optical passage means further comprises a window in the ohmic electrode through which a portion of the upper major surface of the fifth semiconductor layer is exposed and a depression in the upper major surface of the fifth semiconductor layer.

9. A resonant-tunneling transistor as claimed in claim 1, in which said second semiconductor layer has a valence band at an energy level lower than the energy level of the valence band of any of the first semiconductor layer and the third semiconductor layer, said energy level of the valence band of the second semiconductor layer being set to cause the tunneling of the holes through the second semiconductor layer.

10. A resonant-tunneling transistor as claimed in claim 1, in which said second semiconductor layer has a valence band at an energy level higher than the valence band of any of the first and third semiconductor layers, said thickness of the second semiconductor layer being selected to form a quantum state of holes in the second semiconductor layer at an energy level lower than the valence band of the second semiconductor layer.

11. A resonant-tunneling transistor as claimed in claim 10, in which said first, third and fifth semiconductor layers comprise InGaAs while said second and fourth semiconductor layers comprise GaAsSb.

12. A resonant-tunneling transistor as claim in claim 11, in which said first, third and fifth semiconductor layers have a composition of $In_{0.53}Ga_{0.47}As$, while said second and fourth semiconductor layers have a composition of $GaAs_{0.49}Sb_{0.51}$.

13. A resonant-tunneling transistor as claimed in claim 10, in which said first, third and fifth semiconductor layers comprise InP and said second and fourth semiconductor layers comprise InAlAs having a composition which establishes lattice matching with InP.

14. A resonant-tunneling transistor as claimed in claim 10, in which said first, third and fifth semiconductor layers comprise InP and said second and fourth semiconductor layers comprise AlAsSb having a composition which establishes lattice matching with InP.

15. A resonant-tunneling transistor as claimed in claim 1, in which said transistor further comprises a spacer layer, interposed between the upper major surface of the fourth semiconductor layer and the lower major surface of the fifth semiconductor layer, which prevents recombination of the holes accumulated in the hole quantum well of the fourth semiconductor layer and the electrons in the conduction band of the fifth semiconductor layer.

16. A resonant-tunneling transistor as claimed in claim 1, in which said fourth semiconductor layer forms a quantum level of holes in the fourth semiconductor layer at an energy level below the valence band of the fourth semiconductor layer.

* * * * *

UNITED STATES PATENT AND TRADEMARK OFFICE
CERTIFICATE OF CORRECTION

PATENT NO. : 5,266,814
DATED : November 30, 1993
INVENTOR(S) : INATA et al.

It is certified that error appears in the above-indentified patent and that said Letters Patent is hereby corrected as shown below:

Col. 12, line 40, change "claim" (first occurrence) to --claimed--.

Signed and Sealed this

Fourth Day of October, 1994

Attest:

BRUCE LEHMAN

*Attesting Officer*      *Commissioner of Patents and Trademarks*